United States Patent
Beck

(10) Patent No.: US 7,362,099 B2
(45) Date of Patent: Apr. 22, 2008

(54) RANDOMIZED ORDERED K-SPACE SUB-SETS FOR SHARED PRE-PULSES IN MRI

(75) Inventor: Gabriele M. Beck, Venlo (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 123 days.

(21) Appl. No.: 10/570,712

(22) PCT Filed: Aug. 30, 2004

(86) PCT No.: PCT/IB2004/051608

§ 371 (c)(1),
(2), (4) Date: Mar. 6, 2006

(87) PCT Pub. No.: WO2005/024449

PCT Pub. Date: Mar. 17, 2005

(65) Prior Publication Data

US 2006/0273791 A1    Dec. 7, 2006

Related U.S. Application Data

(60) Provisional application No. 60/501,122, filed on Sep. 8, 2003.

(51) Int. Cl.
*G01V 3/00* (2006.01)
(52) U.S. Cl. ........................... 324/309; 324/307
(58) Field of Classification Search ............ 324/309, 324/307, 306
See application file for complete search history.

(56) References Cited

U.S. PATENT DOCUMENTS

| | | | |
|---|---|---|---|
| 5,122,747 A | 6/1992 | Riederer et al. | 324/309 |
| 5,499,629 A | 3/1996 | Kerr et al. | 128/653.2 |
| 5,779,636 A | 7/1998 | Kanazawa | 600/410 |
| 5,912,557 A | 6/1999 | Wilman et al. | 324/309 |
| 6,025,714 A | 2/2000 | Avram et al. | 324/309 |
| 6,144,201 A | 11/2000 | Miyazaki | 324/306 |

(Continued)

FOREIGN PATENT DOCUMENTS

WO    WO 2004/079386 A1    9/2004

OTHER PUBLICATIONS

Johnson, G., et al.; A Comparison of Phase Encoding Ordering Schemes in $T_2$-Weighted GRASE Imaging; 1996; MRM; 36:427-435.

(Continued)

*Primary Examiner*—Louis M Arana

(57) ABSTRACT

A magnetic resonance imaging scanner (10) includes a main magnet (12), magnetic field gradient coils (16), and one or more radio frequency coils (18). A sequence generator (60, 62, 64, 66) generates an anti-ghosting imaging sequence by dividing k-space into a plurality of profile sub-sets. The sequence generator (60, 62, 64, 66) includes a profile sub-sets ordering processor (60, 62, 64) that orders profiles within each profile sub-set such that the order of profiles within each sub-set is generally different from the orders of the other profile sub-sets, and a profile sub-sets acquisition ordering processor (60, 66) that orders the profile sub-sets in accordance with a selected long-term profiles ordering. The magnetic resonance imaging scanner (10) executes the anti-ghosting imaging sequence to generate imaging data. A reconstruction processor (44) reconstructs the generated imaging data into a reconstructed image substantially free of ghosting.

19 Claims, 5 Drawing Sheets

U.S. PATENT DOCUMENTS

| | | |
|---|---|---|
| 6,486,668 B1 | 11/2002 | Ma .......................... 324/307 |
| 6,489,766 B1 | 12/2002 | Alsop ....................... 324/313 |
| 6,515,477 B1 * | 2/2003 | Tasaka et al. ............. 324/309 |
| 6,639,211 B1 * | 10/2003 | Anand et al. ............. 250/282 |
| 2003/0057945 A1 | 3/2003 | Shah et al. ................ 324/307 |

OTHER PUBLICATIONS

Willinek, W.A., et al.; Randomly Segmented Central k-Space Ordering in High-Spatial-Resolution Contrast-enhanced MR . . . ; 2002; Radiology; 225(2)583-588.

* cited by examiner

RANDOMIZED ORDERED K-SPACE SUB-SETS FOR SHARED PRE-PULSES IN MRI

CROSS REFERENCE TO RELATED APPLICATIONS

This application claims the benefit of U.S. provisional application Ser No. 60/501,122 filed Sep. 8, 2003, which is incorporated herein by reference.

The following relates to the diagnostic imaging arts where a plurality of profiles per acquisition cycle or shot is acquired. It finds particular application in magnetic resonance imaging employing shared pre-pulses, and will be described with particular reference thereto. However, it also finds application in navigator gating and tracking sequences or in other synchronized imaging sequences such as cardiac-gated imaging, and in other magnetic resonance applications that advantageously employ shared pre-pulses, such as magnetic resonance spectroscopy and the like.

In magnetic resonance imaging, acquisition of a plurality of profiles that share a pre-pulse is a known technique that reduces the specific absorption ratio (SAR) and reduces imaging time. These advantages are of value in substantially any type of magnetic resonance imaging, and are of particular advantage in high field scanners such as 3 Tesla scanners. Rather than the pre-pulse being an applied pulse for manipulating magnetic resonances such as a fat suppression pre-pulse, a magnetization transfer contrast (MTC) pre-pulse, or the like, the pre-pulse can be a navigator pre-pulse detecting the current position of a moving part of the body or a timing pulse such as a cardiac gating timing pulse indicative of occurrence of a selected cardiac state of the cardiac cycle.

The profile order typically used for this type of application is a segmented k-space approach [see, for example, "Strategies to Improve Contrast in TurboFlash Imaging: Reordered Phase Encoding and K-Space Segmentation", D. Chien, D. A. Atkinson and R. A. Edelman J. Magn. Res. Im., 1 p. 63 (1991)]. The segmented acquisition approach that is typically used for this type of imaging (shared pre-pulses) produces good image quality and does not lead to substantial signal degradation or image ghosting. However, employing the segmented acquisition approach limits the option of using a profile ordering selected for contrast weighting, motion suppression, or the like.

For example, in contrast enhanced MRA, a 'centric', 'CENTRA', or other long-term profile ordering is preferably used to rapidly collect imaging data for a contrast bolus while it passes through arteries of interest. The centric, CENTRA, or similar profile orderings advantageously collect imaging data around the center of k-space first, followed by collection of k-space data further out from the center of k-space. Similarly, selected profile acquisition orderings can provide advantageous motion suppression or fat suppression in the reconstructed images. Because the segmented acquisition approach imposes a particular profile ordering to reduce ghosting or other artifacts, the ordering is not simultaneously selectable to implement a centric, CENTRA, or other advantageous ordering.

The present invention contemplates an improved apparatus and method that overcomes the aforementioned limitations and others.

According to one aspect, a magnetic resonance imaging method is provided. K-space is divided into a plurality of profile sub-sets. A profile ordering is selected for each profile sub-set. Profiles of the plurality of profile sub-sets are acquired. Profiles of each sub-set are acquired in the profile ordering selected for that profile sub-set. The profile sub-sets are acquired in a selected profile sub-sets acquisition order. The acquired profiles of the plurality of profile sub-sets are reconstructed into a reconstructed image.

According to another aspect, a magnetic resonance imaging apparatus is disclosed. A means is provided for dividing k-space into a plurality of profile sub-sets. A means is provided for selecting a profile ordering for each profile sub-set. An imaging data acquisition means is provided for acquiring profiles of the plurality of profile sub-sets with profiles of each sub-set being acquired in the profile ordering selected for that profile sub-set and the profile sub-sets being acquired in a selected profile sub-sets acquisition order. A means is provided for reconstructing the acquired profiles of the plurality of profile sub-sets into a reconstructed image.

One advantage resides in enabling selection of a long-term ordering for profile sub-sets to implement contrast weighting, motion suppression, or other techniques, while providing substantial reduction in ghosting or other image artifacts through selection of short-term ordering within each profile sub-set. The generally different ordering, such as a random ordering, of each profile sub-set reduces ghosting in reconstructed images that employ shared pre-pulses and ghost reduction in conjunction with acquisition of an image slice or a three-dimensional image volume.

Another advantage resides in providing contrast enhanced or breath hold MR imaging using a generally centric long-term profile sub-sets ordering or another long-term sub-sets ordering that advantageously acquires a central region of k-space first, while providing a randomized or other ghost-suppressing ordering within each profile sub-set Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

FIG. 1 diagrammatically shows a magnetic resonance imaging system for performing magnetic resonance imaging using shared pre-pulses with randomized or otherwise generally asymmetrical and uncorrelated ordering of profiles within profile sub-sets.

FIG. 2 diagrammatically shows a magnetic resonance imaging pulse sequence employing three shots each including a shared pre-pulse and randomized ordering of the shared profiles within each shot, and a ping-pong low-high long-term acquisition ordering of the profile sub-sets.

Figure 1:
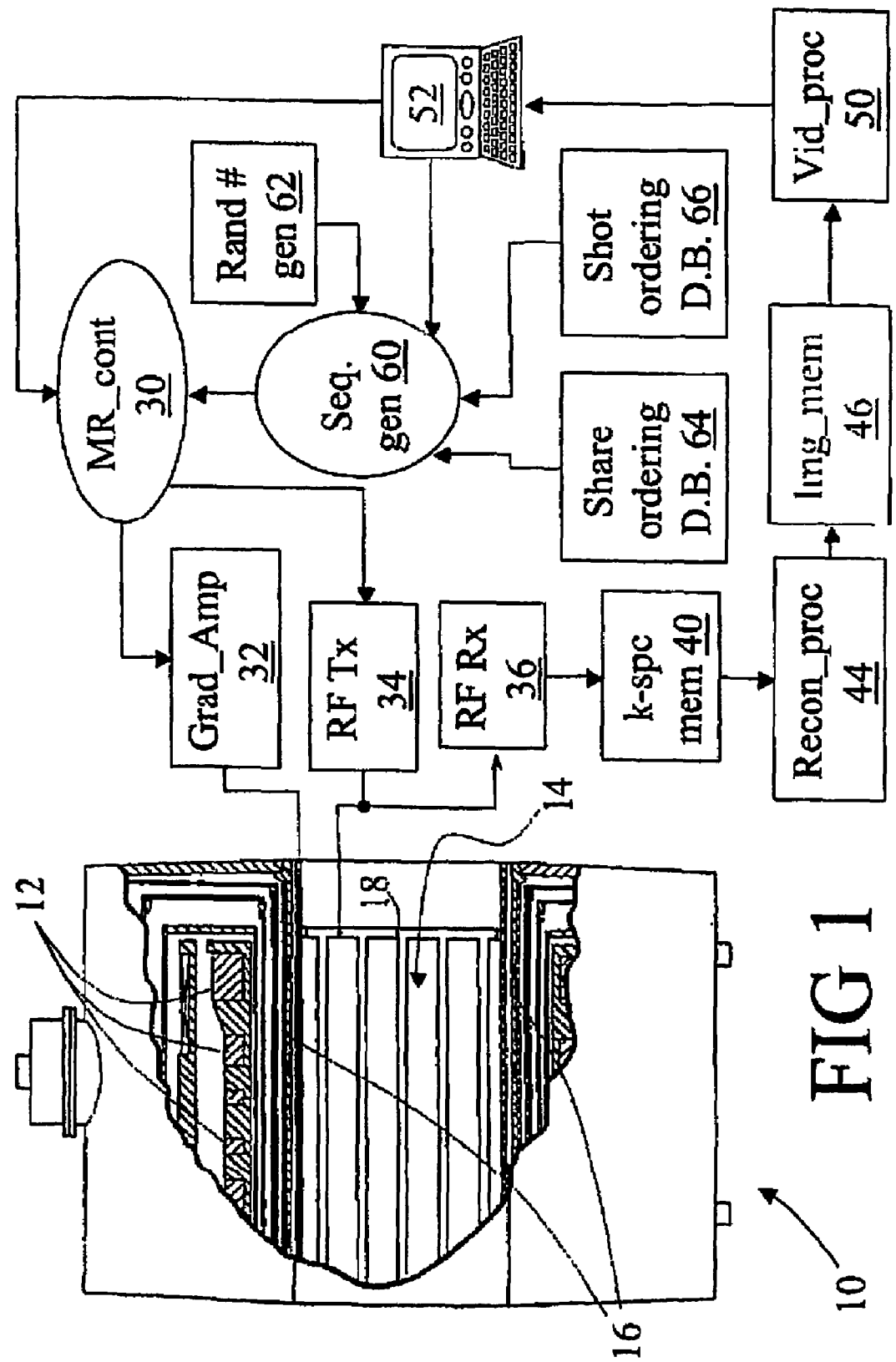

With reference to FIG. 1, a magnetic resonance imaging scanner 10 includes main magnet coils 12, which are preferably superconducting coils, although resistive main magnet coils or a permanent magnet can also be employed. The main magnet coils 12 are energized to generate a substantially uniform main magnetic field in an examination region 14. Magnetic field gradient coils 16 produce gradients in selected spatial directions to spatially encode magnetic resonances that are generated by energizing a radio frequency coil 18. In FIG. 1, a whole-body radio frequency coil 18 is shown; however, local coils such as head coils, phased radio frequency coil arrays, SENSE coils, and the like can be used instead of or in conjunction with the whole-body radio frequency coil 18 to excite magnetic resonances and/or to detect magnetic resonance echoes.

A magnetic resonance sequence controller 30 coordinates and controls a radio frequency transmitter 34 that is coupled to the whole-body radio frequency coil 18 or another radio frequency coil to excite magnetic resonance echoes, and controls magnetic field gradient controllers 32 coupled to the gradient coils 16 to spatially encode the excited magnetic resonance echoes. One or more radio frequency receivers 36 coupled to the whole-body radio frequency coil 18 or another radio frequency coil detect, demodulate, and digitize the magnetic resonance echoes and store digital magnetic resonance samples in a k-space memory 40. A reconstruction processor 44 performs a Fourier transform-based image reconstruction or another type of image reconstruction to generate one or more reconstructed images from the stored k-space magnetic resonance samples.

The reconstructed images are stored in an image memory 46, processed by a video processor 50 and displayed on a user interface 52, transmitted over a local computer network or the Internet, or otherwise processed. Preferably, the user interface 52 includes a display, printer, or other output device that allows a radiologist or other operator to view, render, or otherwise manipulate the reconstructed images. Moreover, the user interface 52 preferably enables the radiologist or other operator to communicate with the magnetic resonance sequence controller 30 to create magnetic resonance imaging sequences, modify imaging sequences, execute imaging sequences, or otherwise control the magnetic resonance imaging scanner 10.

In performing imaging using shared pre-pulses, a sequence generator 60 preferably generates a suitable imaging sequence including a preferred grouping of profiles into profile sub-sets. Each profile sub-set shares one or more pre-pulses. The pre-pulse and the following profile sub-set are also referred to herein as a shot. Equation (1) provides a relationship between a total number of profiles ($N_{profiles}$) a number of shots ($N_{shots}$), and a sharing factor (r) according to:

$$N_{shots} = \frac{N_{profiles}}{r}, \quad (1)$$

where the sharing factor r indicates a number of profiles within each shot.

To substantially reduce ghosting, the profiles within each shot are preferably ordered respective to the profiles of other shots such that the profile order is generally different from and substantially uncorrelated and asymmetric with respect to the profile orders of other shots. In one approach, the sequence generator 60 accesses a random number generator 62 to produce randomized profile orders within each shot. It is to be understood that the random number 62 may be a random number generator or a pseudo-random number generator of a type commonly employed in computer systems. In another approach, a share ordering database 64 is accessed to retrieve profile orders for each profile sub-set such that each retrieved profile order is generally different from and substantially uncorrelated with other retrieved profile orders. In yet another approach the sequence generator 60 receives user input of suitably different profile sub-set orders from the user interface 52.

While the ordering of profiles within each profile sub-set or shot is preferably randomized or otherwise selected to reduce ghosting or other artifacts, a long term ordering of the shots or profile sub-sets is preferably selected from a shot ordering database 66. The shot or profile sub-sets ordering defines the long-term profiles ordering of the image acquisition, and can be selected as a ping-pong low-high long term ordering, a centric, ordering, or other suitable ordering. For example, a centric, CENTRA, or other ordering that preferentially acquires generally centrally located k-space data first before acquiring outlying k-space data is advantageously employed in contrast enhanced MRA. The centric, CENTRA, or similar profile sub-sets ordering selected from the shot ordering database 66 advantageously acquires k-space data generally located around the center of k-space first, followed by acquisition of k-space data located more distally from the center of k-space. Similarly, profile sub-sets acquisition orderings selected from the shot ordering database 66 can provide advantageous motion suppression or fat suppression in the reconstructed images.

Once a suitable imaging sequence including selected short-term profile orders within each shot or sub-set and a selected long term shot order is constructed by the sequence generator 60, the magnetic resonance sequence controller 30 executes the constructed sequence to acquire imaging data. The imaging data is reconstructed by the reconstruction processor 44 and the resultant image is displayed on the user interface 52 or is otherwise utilized.

Figure 2:
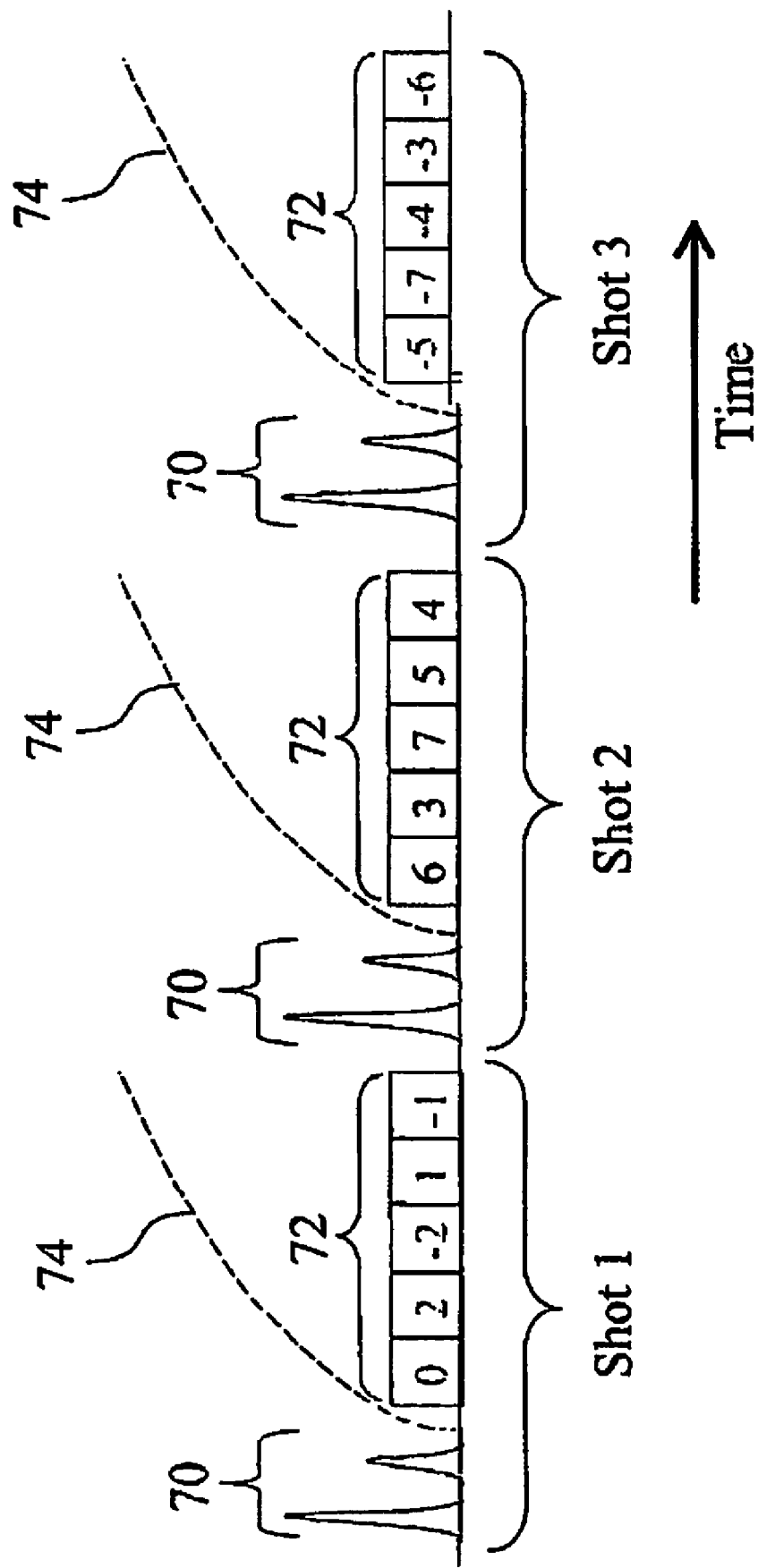

With continuing reference to FIG. 1 and with further reference to FIG. 2, an exemplary imaging sequence constructed by the sequence generator 60 is described. The imaging sequence has a sharing factor r=5, that is, there are five shared profiles per pre-pulse. In the exemplary sequence k-space is imaged in integer steps between $k_y=7$ and $k_y=7$ inclusive, in unitary steps. The number of profiles is 15, and the 15 profiles are acquired using three shots. The three shots are labeled "Shot 1", "Shot 2", and "Shot 3" in FIG. 2. Each shot includes a pre-pulse 70 and a profile sub-set 72.

The pre-pulse can be substantially any magnetic resonance excitation or manipulation that produces selected magnetic resonance characteristics. For example, the pre-pulse 70 can be a fat saturation pre-pulse, a magnetization transfer contrast (MTC) pre-pulse, or the like. Preferably, each profile of the sub-set 72 has its own excitation pulse, which is not shared amongst the other profiles of the profile sub-set. Alternatively, an excitation pulse may be shared by a small number of profiles of the corresponding profile sub-set. Rather than or in addition to exciting or manipulating magnetic resonances, the pre-pulse 70 can correspond to a navigator pre-pulse that allows detecting the current position of a moving part of the body, or a timing signal such as a cardiac gating signal that synchronizes acquisition of the profile sub-set 72 with the cardiac cycle.

The pre-pulse 70 causes or is indicative of a generally temporally varying magnetic resonance response. In FIG. 2, each pre-pulse 70 generates or is indicative of a time-dependent response 74 that increases with time. However, it will be appreciated that other time dependencies of the magnetic resonance response may occur depending upon the selected pre-pulse, such as a temporally decaying time-dependent response. For a physiological gating pre-pulse, the time dependent response 74 is a spatially varying magnetic resonance produced by cardiac motion, changes in blood flow, and the like.

The time-dependent response 74 is substantially the same for each pre-pulse 70. As a result, the value of the time-dependent response 74 for each profile position in each profile sub-set 74 is substantially the same. For instance, in FIG. 2 the exemplary increasing time-dependent response 74 has a lowest response value for the first acquired profile of each profile sub-set 74, and has a highest response value for the last acquired profile of each profile sub-set 74. Preferably, the pre-pulse 70 and the profile sub-set 72 are relatively temporally arranged to provide optimal pre-pulse performance (for example, optimal weighting in the case of an MTC pre-pulse, or a minimally moving cardiac muscle in the case of a cardiac gating pre-pulse) for the central profile of the profile sub-set 74. For the exemplary profile sub-set 74 containing five profiles, the optimization is preferably for the third profile acquired.

For the profiles of the sub-set other than the central profile, the pre-pulse provides less than optimal performance for profiles acquired before or after the central profile. If the ordering of profiles within each profile sub-set 72 has a substantial symmetry or correlation, this non-uniform response can collectively lead to ghosting or other image degradation in the reconstructed image. For example, if the profiles within each profile sub-set run from lowest value of $k_y$ to largest value of $k_y$, then a periodicity with a repetition period corresponding to the number of pre-pulse sharing profiles r within each shot is typically introduced into the acquired imaging data. Upon processing by the reconstruction processor 44, this periodicity in k-space can lead to image ghosting.

Figure 3:
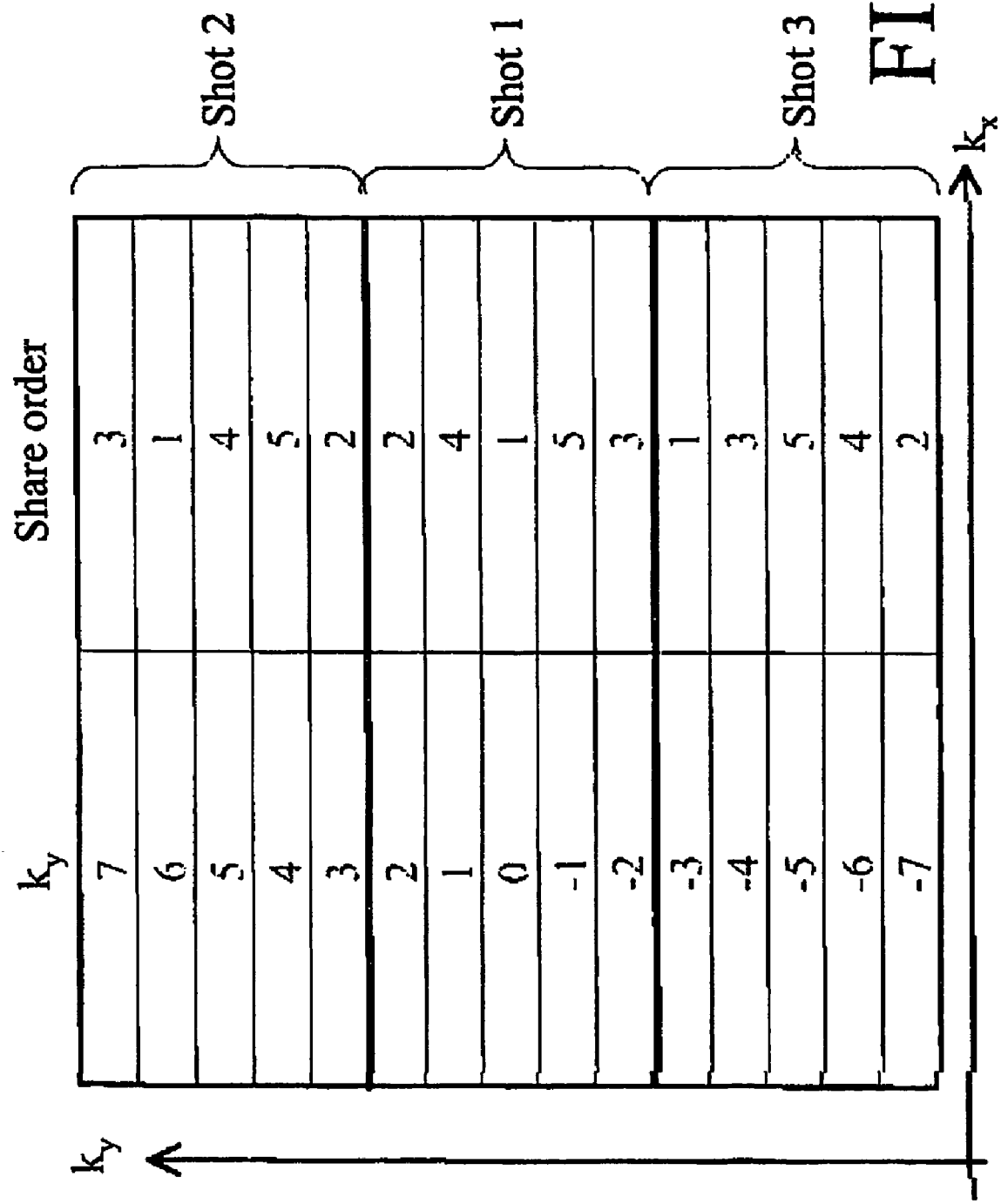
FIG. 3 shows a k-space diagram of the data acquisition performed by the pulse sequence of FIG. 2, including indications of the pre-pulse and share order for each profile. The shots are identified at the right-hand side, showing the ping-pong low-high long-term acquisition ordering of the profile sub-sets acquired by the shots.

With continuing reference to FIGS. 1 and 2 and with further reference to FIG. 3, to suppress such image degradation the profiles within each profile sub-set have a generally different ordering which is asymmetric and uncorrelated with respect to orderings of other profile sub-sets. As best seen in FIG. 3, the exemplary magnetic resonance sequence acquires k-space data in the phase encode ($k_y$) and readout ($k_x$) directions for a rectangular planar slice, and each profile corresponds to a line of readout $k_x$ values at a fixed phase encode $k_y$ value. In this exemplary embodiment, "Shot 1" which is the first shot acquires a central profile sub-set $k_y \in \{-2, -1, 0, 1, 2\}$, where the braces {} indicate an unordered set. "Shot 2" acquires a profile sub-set $k_y \in \{3, 4, 5, 6, 7\}$ containing higher positive profiles. "Shot 3" acquires a profile sub-set $k_y \in \{-, -6, -5, -4, -3\}$ containing higher negative profiles. The distribution of the profile sub-sets in the embodiment of FIGS. 2 and 3 is a ping-pong type high-low shot ordering such that the central portion of k-space is acquired first, which is advantageous in time-sensitive imaging such as contrast agent-assisted imaging wherein high contrast imaging data is available for a limited time after the contrast agent is administered.

Within each shot, the profiles of the profile sub-set have an ordering that is generally different from and uncorrelated with the ordering of the other profile sub-sets. Specifically to the present example, "Shot 1" has a profile ordering $k_y$=[0, 2, -2, 1, -1] where the brackets [] indicate an ordered set. "Shot 2" has a profile ordering $k_y$=[6, 3, 7, 5,4], and "Shot 3" has a profile ordering $k_y$=[-5, -7, -4, -3, -6]. To appreciate a substantial lack of correlation or symmetry between these orderings, it is useful to denote the share order for each profile in k-space, as shown in FIG. 3. In "Shot 1", $k_y$=0 is acquired first and has a share order=1, $k_y$=2 is acquired second and has a share order=2, $k_y$=-2 is acquired third and has a share order=3, $k_y$=1 is acquired fourth and has a share order=4, and $k_y$=-1 is acquired last and has a share order=5. Listing the share ordering by increasing $k_y$ value gives a share ordering of [3, 5, 1, 4, 2] for "Shot 1". By analogous analysis, the share ordering for "Shot 2" is [2, 5, 4, 1, 3] and the share ordering for "Shot 3" is [2, 5, 1, 3, 4]. These share orders are indicated in FIG. 3 under a "Share order" column. In general, the share order values for each profile sub-set ranges from 1 to r where r is the sharing factor and indicates the number of profiles in each profile sub-set.

In a preferred embodiment, the sequence generator 60 segments k-space and computes suitable orderings for each profile sub-set by accessing the random number generator 62 to calculate a generally different randomized share ordering for application to each profile sub-set. Typically, randomized share orderings provide profile sub-sets having orderings that are substantially uncorrelated and asymmetric with respect to one another. When k-space has more data lines, as is typical in most modern imaging procedures, each segment of k-space can be filled with data collected over two or more shots.

Optionally, after the randomized share orderings are computed for the profile sub-sets, the sequence generator performs a comparison of the randomized share orderings of each pair of profile sub-sets to check for undesirable correlations. For example, such a check may indicate a problematic correlation between the share orderings of "Shot 2" and "Shot 3" insofar as these two share orderings both start with the sequence [2, 5, . . . ]. If such a correlation is deemed undesirable, the comparison triggers a new randomized share order computation for one of the two shots.

Instead of having the sequence generator 60 compute randomized orderings when creating the magnetic resonance imaging sequence, the sequence generator 60 can suitably access the share ordering database 64 to obtain a different stored share ordering for application to each profile sub-set. The stored share orderings can be generated using the random number generator 62. In another approach, substantially uncorrelated and asymmetric share orderings are manually selected and input to the share ordering database 64. In yet another approach, image simulation is employed for various share ordering selections, and share orderings that provide substantial reduction in ghosting in the simulated images are selected and stored in the share ordering database 64. In an empirical approach, a substantially uniform phantom is imaged using various imaging sequences having profile sub-sets with different share orderings, and share ordering of sequences that produce substantially ghost-free reconstructed images are selected and stored in the share ordering database 64.

The share ordering of each profile sub-set is preferably generally different from the share orderings of the other sub-sets. Preferably, the generally different orderings of the various profile sub-sets are unique orderings; that is, each profile sub-set preferably has a unique share order that is different from all other profile sub-sets in the pulse sequence.

In some cases the generally different orderings may include one or a few similar or identical share orderings. Considering the example of FIG. 2, the five profiles within each profile sub-set 72 can be ordered in 5!=120 different ways. Hence, if the number of shots exceeds 120, some orderings will be repeated. Substantial ghost reduction is still achieved in the presence of occasional randomly repeating similarities between share orderings or in the presence of occasional repetitions of share orderings. Hence, the share orderings are considered to be generally different from one another even if there is an occasional similarity or repetition of a share order among the profile sub-sets.

In preferred embodiments, the profile orderings are randomly generated in conjunction with the random number generator 62. However, it is also contemplated to compute substantially non-correlated and asymmetric profile orders for the profile sub-sets based on first principles analysis of the pulse sequence and the image reconstruction process. Such computed profile orders are not random, but are generally different from one another to avoid significant artifacting.

The magnetic resonance sequence can be substantially any type of sequence. Generally balanced type of sequences benefit from the division in sub-sets avoiding eddy current artifacts. In one preferred embodiment, the sequence is a balanced field echo sequence.

Figure 4:
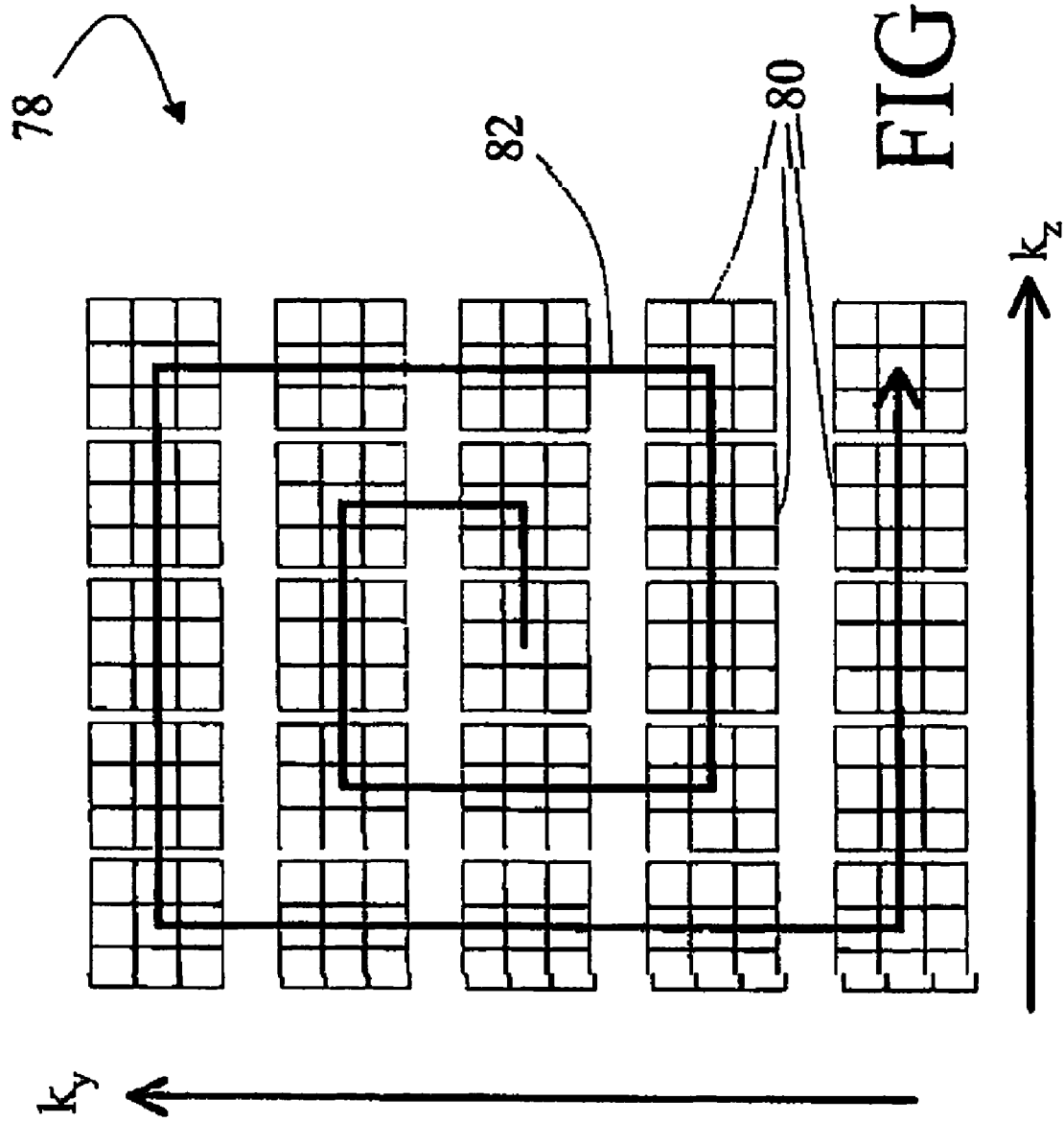
FIG. 4 shows a three-dimensional volume data acquisition using a plurality of profile sub-sets in which the profiles of each profile sub-set share a pre-pulse and the profile sub-sets are acquired in a generally centric acquisition order.

With reference to FIG. 4, the disclosed use of generally different profile orderings for profile sub-sets to reduce image degradations such as ghosting is applicable to non-planar or non-slice-based three-dimensional imaging. FIG. 4 shows $k_y$-$k_z$ dimensions of a k-space 78. The $k_y$-$k_z$ dimensional components are sectioned into generally square or rectangular profile sections or sub-sets 80 each containing nine profiles arranged in 3×3 configuration in the $k_y$ and $k_z$ directions in the illustrated example. Each profile is acquired along a $k_x$-oriented readout direction that is perpendicular to the $k_y$ and $k_z$ directions, and the nine profiles of each profile sub-set 80 share a single pre-pulse (sharing factor r=9). The profile sub-sets 80 are preferably acquired along a generally centric ordering 82 of the profile sub-sets 80 in which the profile sub-set at the center of the k-space 78 is acquired first, and the order of profile sub-set acquisition spirals outward from the center of k-space 78. However, other orderings of acquisition of the profile sub-sets 80 can be employed.

In a preferred embodiment, an asymmetry factor is determined by a ratio of the field of view in the y- and z-directions. The profiles within each profile sub-set 80 define a contiguous segment of k-space with an anisotropy in the y-z plane determined by the asymmetry factor.

In one alternative embodiment, the sharing factor can be reduced to r=3. Three pre-pulses are each followed by three profiles, with random ordering among the nine profiles. In another alternative embodiment in which the sharing factor r=5, the fifth profile of the second shot becomes a first profile in the next 3×3 section of k-space. The carryover profile, like the profiles within each section, can be a randomly selected one of the nine profiles.

As with the planar slice acquisition described with reference to FIGS. 2 and 3, the centric acquisition of FIG. 4 can suffer from ghosting or other image degradation due to symmetries or correlations of profile orderings across profile sub-sets 80. Such image degradation is substantially suppressed by employing the sequence generator 60 to produce different randomized or otherwise uncorrelated and asymmetric profile orders for each of the profile sub-sets 80. In this case, each share ordering is defined by a 3×3 matrix whose elements have share ordering values ranging from 1 to r=9.

Figure 5:
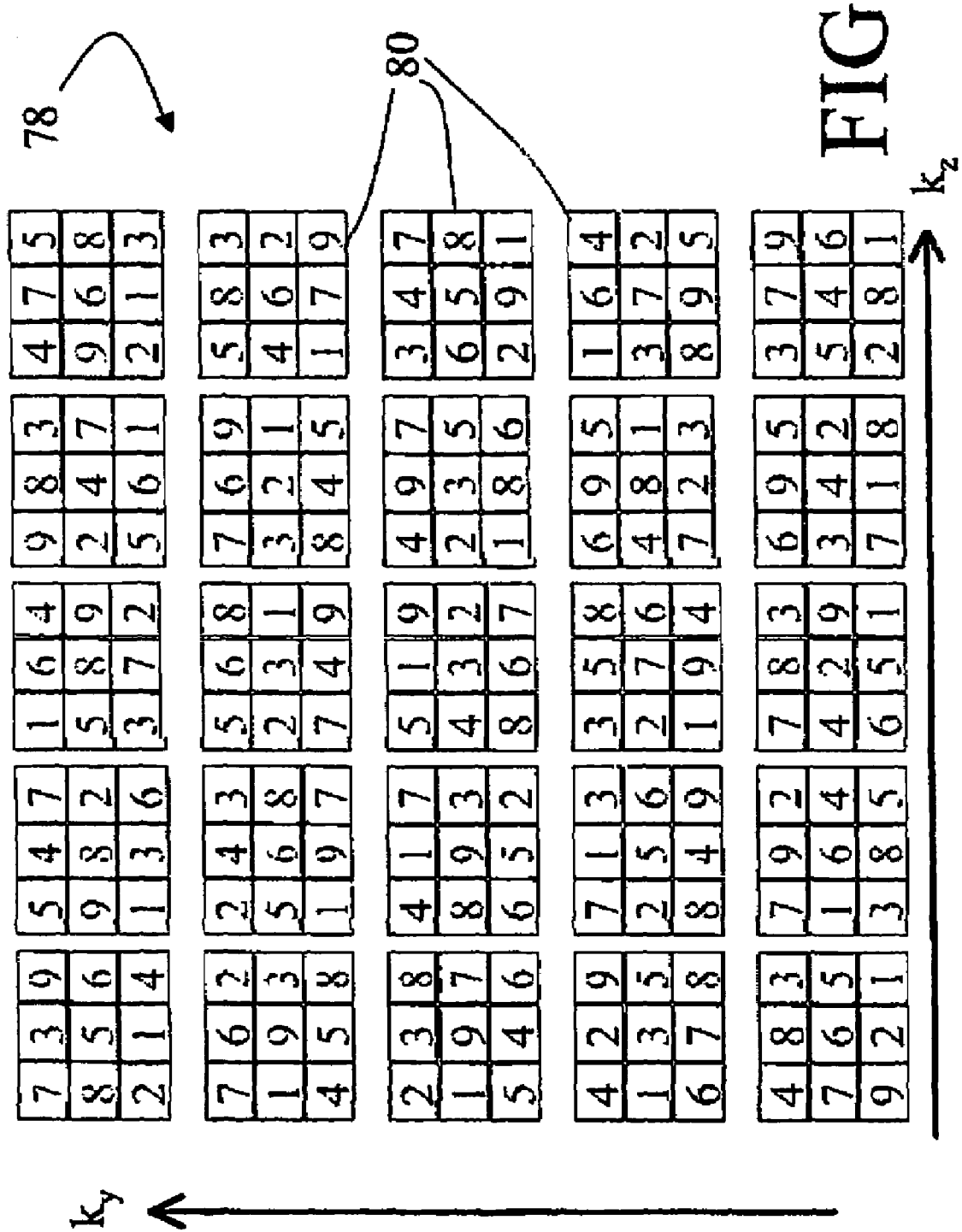
FIG. 5 show exemplary randomized share ordering for the profile sub-sets of FIG. 4.

With reference to FIG. 5, the $k_y$-$k_z$ k-space 78 of FIG. 4 is shown with randomly calculated 3×3 sharing orders indicated for each profile sub-set 80. The sharing order values for each profile sub-set 80 run from 1 to r=9, and indicate the order acquisition of the profile within the shot that acquires that profile sub-set 80. The sharing orders of FIG. 5 were computed using a pseudo-random number generator without performing any post-computational comparison to detect similar or identical share orders. For sharing order r=9, it will be appreciated that the number of possible share orderings is 9!=362,880. Hence, a likelihood of exact repetition of share ordering between two profile sub-sets 80 is low.

The ordering described with reference to FIGS. 4 and 5 employs random ordering within each 3×3 profile sub-set 80, and employs a centric ordering 82 of the profile sub-sets 80 to acquire the central region of k-space 78 first. The centric ordering 82 is advantageous for example when acquiring contrast agent-assisted imaging data because the contrast agent-induced contrast decays away over time. It will be appreciated, however, that other orderings of the profile sub-sets besides the exemplary centric ordering 82 can be used. For substantially any such ordering of the profile sub-sets, the randomized or otherwise asymmetric and uncorrelated ordering of profiles within each profile sub-set 80 advantageously reduces ghosting or other image degradations.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A magnetic resonance imaging method including:
    dividing k-space into a plurality of profile sub-sets;
    selecting a profile ordering for each profile sub-set to minimize ghosting in the reconstructed image;
    acquiring profiles of the plurality of profile sub-sets, profiles of each sub set being acquired in the profile ordering selected for that profile sub-set, the profile sub-sets being acquired in a selected profile sub-sets acquisition order; and
    reconstructing the acquired profiles of the plurality of profile sub-sets into a reconstructed image.

2. The magnetic resonance imaging method as set forth in claim 1, wherein the selecting of a profile ordering for each profile sub set includes:
    selecting an order of profiles within each profile sub-set, wherein the selected order of profiles within each profile sub-set is generally different from the selected orders of the other profile sub-sets.

3. The magnetic resonance imaging method as set forth in claim 2, wherein the acquiring of profiles includes for each profile sub-set:
    generating a shared pre-pulse; and
    acquiring profiles of the profile sub-set subsequent to the generating of the shared pre-pulse.

4. The magnetic resonance imaging method as set forth in claim 3, wherein the generating of a shared pre-pulse includes one of:
    generating a pre-pulse that manipulates magnetic resonance,
    generating a navigator pre-pulse that detects a motion state, and
    generating a cardiac gating signal indicative of a cardiac state.

5. The magnetic resonance imaging method as set forth in claim 2, wherein:
    each profile corresponds to a one-dimensional line along a readout direction; and
    the profiles within each profile sub-set define a contiguous segment of k-space.

6. The magnetic resonance imaging method as set forth in claim 5, wherein the selected profile sub-sets acquisition order includes:

acquiring profile sub-sets close to a center of k-space first; and acquiring profile sub-sets distal from the center of k-space after the acquiring of profile sub-sets close to the center of k-space.

7. The magnetic resonance imaging method as set forth in claim 1, wherein:

the k-space is a three-dimensional k-space and each profile corresponds to a one-dimensional line of the three-dimensional k-space;

an asymmetry factor is determined by a ratio of the field of view in y- and z-directions; and the profiles within each profile sub-set define a contiguous segment of k-space with an anisotropy in the y-z plane determined by the asymmetry factor.

8. The magnetic resonance imaging method as set forth in claim 1, wherein the selecting of a profile ordering to minimize ghosting in the reconstructed image comprises:

randomly ordering the profiles within each profile sub-set.

9. The magnetic resonance imaging method as set forth in claim 1, wherein the selecting of a profile ordering for each profile sub-set includes one of:

randomly ordering the profiles within each profile sub-set, selecting an order based on a stored sharing order for each profile sub-set, wherein a different stored sharing order is used in selecting the order of profiles in each profile sub-set, and selecting an order of profiles within each sub-set that is generally asymmetric and uncorrelated with respect to the selected orders of the other profile sub-sets.

10. The magnetic resonance imaging method as set forth in claim 1, wherein the acquiring of profiles includes:

for each profile, exciting resonance and causing a single echo, the profile being acquired during the echo.

11. The magnetic resonance imaging method as set forth in claim 1, wherein:

the acquiring of profiles uses a balanced field echo sequence.

12. The magnetic resonance imaging method as set forth in claim 1, wherein the dividing of k-space into a plurality of profile sub-sets defines at least one outer profile sub-set corresponding to a region of k-space not including the center of k-space, and the selecting of a profile ordering for each profile sub-set to minimize ghosting in the reconstructed image includes selecting a profile ordering for the at least one outer profile sub-set to minimize ghosting in the reconstructed image.

13. A magnetic resonance imaging method including:

dividing k-space into a plurality of profile sub-sets satisfying:

$$N_{shots} = \frac{N_{profiles}}{r}$$

where $N_{profiles}$ is a number of profiles of the divided k space, $N_{shots}$ is a total number of the profile sub-sets comprising the plurality of profile sub sets, and r is a total number of profiles included in each profile sub-set;

selecting a profile ordering for each profile sub-set;

acquiring profiles of the plurality of profile sub-sets, profiles of each sub set being acquired in the profile ordering selected for that profile sub-set, the profile sub-sets being acquired in a selected profile sub-sets acquisition order; and reconstructing the acquired profiles of the plurality of profile sub-sets into a reconstructed image.

14. A magnetic resonance imaging apparatus comprising:

a sequence generator configured to divide k-space into a plurality of profile sub-sets and to access a random number generator to generate a randomized order of profiles for each one of the plurality of profile sub-sets;

a magnetic resonance scanner acquiring each profile sub-set with the profiles acquired in the randomized order of profiles for that profile sub-set and with the profile sub-sets acquired in a selected profile sub-sets acquisition order; and a reconstruction processor reconstructing the acquired profiles of the plurality of profile sub-sets into a reconstructed image.

15. The magnetic resonance imaging apparatus as set forth in claim 14, wherein the magnetic resonance scanner generates a single shared pre-pulse and acquires the plurality of profiles of a corresponding profile sub-set in the randomized order of profiles for that profile sub-set.

16. The magnetic resonance imaging apparatus as set forth in claim 14, wherein the magnetic resonance imaging scanner includes:

a main magnet which generates a main magnetic field in an imaging region;

magnetic field gradient coils which generate selected magnetic field gradients across the imaging region; and one or more radio frequency coils which generate radio frequency excitation pulses and detect magnetic resonance signals.

17. The magnetic resonance imaging apparatus as set forth in claim 16, wherein the main magnetic field is at least 3 Tesla.

18. The magnetic resonance imaging apparatus as set forth in claim 16, wherein the magnetic resonance scanner causes imaging data for each profile to be generated by causing the radio frequency coils to excite resonance and controlling at least one of the radio frequency coils and the gradient coils to form a resonance echo and with the radio frequency coils reading out a corresponding profile during the formed echo.

19. The magnetic resonance imaging apparatus as set forth in claim 14, wherein at least one of the plurality of profile sub-sets corresponds to an outer k-space region that does not include the center of k-space, and the sequence generator accesses the random number generator to generate a randomized order of profiles for the at least one of the plurality of profile sub-sets corresponding to an outer k-space region that does not include the center of k-space.

* * * * *